(12) United States Patent
Muldoon et al.

(10) Patent No.: US 12,734,922 B2
(45) Date of Patent: Sep. 15, 2026

(54) CHARGING STATION IMPEDANCE MEASUREMENT AND CONTROL OF CHARGING PROCESSES

(71) Applicant: GM Global Technology Operations LLC, Detroit, MI (US)

(72) Inventors: Steven Earl Muldoon, Royal Oak, MI (US); Akshay Sarin, Auburn Hills, MI (US); Alan B. Martin, Washington, MI (US); Yue-Yun Wang, Troy, MI (US); Joseph Berg, Highland, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 577 days.

(21) Appl. No.: 18/460,947

(22) Filed: Sep. 5, 2023

(65) Prior Publication Data

US 2025/0074238 A1 Mar. 6, 2025

(51) Int. Cl.
*B60L 53/62* (2019.01)
*G01R 31/389* (2019.01)

(52) U.S. Cl.
CPC ............ *B60L 53/62* (2019.02); *G01R 31/389* (2019.01)

(58) Field of Classification Search
CPC .......... B60L 53/62; B60L 53/60; B60L 53/22; B60L 53/54; B60L 53/67; G01R 31/389
See application file for complete search history.

(56) References Cited

U.S. PATENT DOCUMENTS

| | | | |
|---|---|---|---|
| 9,461,320 B2 | 10/2016 | Ballantine et al. | |
| 11,424,635 B2 | 8/2022 | Wang et al. | |
| 2012/0326668 A1 | 12/2012 | Ballatine et al. | |
| 2019/0317153 A1 | 10/2019 | Pan et al. | |
| 2023/0142690 A1 | 5/2023 | Muldoon et al. | |
| 2023/0221375 A1 | 7/2023 | Wang et al. | |
| 2023/0318346 A1* | 10/2023 | Fasching .................. | H02J 7/82 |

OTHER PUBLICATIONS

German Office Action for German Application No. 102023128175.5; dated Jul. 17, 2024; 8 pages.

* cited by examiner

*Primary Examiner* — Daniel Cavallari
(74) *Attorney, Agent, or Firm* — CANTOR COLBURN LLP

(57) ABSTRACT

A system includes a conversion device of a charging station, the conversion device connected to a first energy source of the charging station, and a controller configured to perform an impedance measurement applied to an energy storage system, the energy storage system selected from at least one of a second energy source of the charging station and a battery system of a vehicle. The controller is configured to cause the first energy source to generate a first excitation signal for measuring a first energy source impedance, control the conversion device to adjust a parameter of the first excitation signal to convert the first excitation signal to a converted excitation signal, apply the converted excitation signal to the energy storage system, detect a current response of the energy storage system, and estimate the impedance of the energy storage system based on the current response.

20 Claims, 8 Drawing Sheets

CHARGING STATION IMPEDANCE MEASUREMENT AND CONTROL OF CHARGING PROCESSES

INTRODUCTION

The subject disclosure relates to energy or power transfer, and more particularly to systems and methods for controlling power transfer among energy storage systems having different parameters.

Vehicles, including gasoline and diesel powered vehicles, as well as electric and hybrid electric vehicles, feature battery storage for purposes such as powering electric motors, electronics and other vehicle subsystems. Battery assemblies may be charged using dedicated charging stations and other power sources such as residences and buildings connected to a power grid. Such charging stations include a power source (e.g., connection to an electrical grid), or one or more energy sources (e.g., batteries, fuel cells, etc.) in the case of mobile charging stations. Various conversion devices are utilized in charging processes in which a voltage output of a charging station is different than recipient battery system.

SUMMARY

In one exemplary embodiment, a system includes a conversion device of a charging station, the conversion device connected to a first energy source of the charging station, and a controller configured to perform an impedance measurement applied to an energy storage system, the energy storage system selected from at least one of a second energy source of the charging station and a battery system of a vehicle. The controller is configured to cause the first energy source to generate a first excitation signal configured for measuring a first energy source impedance, control the conversion device to adjust a parameter of the first excitation signal to convert the first excitation signal to a converted excitation signal that is configured for measuring an impedance of the energy storage system, apply the converted excitation signal to the energy storage system, detect a current response of the energy storage system, and estimate the impedance of the energy storage system based on the current response.

In addition to one or more of the features described herein, the controller includes at least one of a processing device internal to the charging station and a processing device of the vehicle, and the controller is configured to control a charging operation based on the estimated impedance.

In addition to one or more of the features described herein, the controller is configured to provide the estimated impedance to a data collection system, the data collection system configured to collect a plurality of impedance measurements for analysis.

In addition to one or more of the features described herein, the controller is configured to estimate or predict a state of the energy storage system based on at least one of the estimated impedance, and impedance data derived one or more other vehicles.

In addition to one or more of the features described herein, the converted excitation signal is applied to the battery system of the vehicle, the vehicle including a processor configured to detect a current from the battery system of the vehicle in response to the converted excitation signal, and process the current to estimate the impedance of the battery system of the vehicle.

In addition to one or more of the features described herein, the first energy source is a fuel cell power system, the fuel cell power system including a fuel cell and an internal impedance measurement system, and the first excitation signal is generated by the internal impedance measurement system.

In addition to one or more of the features described herein, the second energy source is a battery system of the charging station.

In addition to one or more of the features described herein, the conversion device is a direct current (DC)-DC converter electrically connected to the energy storage system.

In addition to one or more of the features described herein, the charging station includes a plurality of first energy sources, each first energy source connected to a respective conversion device, the respective conversion devices configured to be used to concurrently measure impedances of multiple energy storage systems.

In addition to one or more of the features described herein, the first energy source includes a fuel cell power system of the charging station, the second energy source includes an internal charging station battery system, and the charging station includes an electrical junction controllable by the controller to direct the converted excitation signal to the internal charging station battery system or the battery system of the vehicle.

In another exemplary embodiment, a method includes causing a first energy source to generate a first excitation signal configured for measuring a first energy source impedance of a first energy source, the first energy source being part of a charging station, and controlling a conversion device of the charging station by a controller, the conversion device connected to the first energy source of the charging station. The conversion device is controlled to adjust a parameter of the first excitation signal to convert the first excitation signal to a converted excitation signal that is configured for measuring an impedance of an energy storage system, the energy storage system selected from at least one of a second energy source of the charging station and a battery system of a vehicle. The method also includes applying the converted excitation signal to the energy storage system, detecting a current response of the energy storage system, and estimating an impedance of the energy storage system based on the current response.

In addition to one or more of the features described herein, the controller includes at least one of a processing device internal to the charging station and a processing device of the vehicle, and the controller is configured to control a charging operation based on the estimated impedance.

In addition to one or more of the features described herein, the method includes providing the estimated impedance a data collection system, the data collection system configured to collect a plurality of impedance measurements for analysis thereof.

In addition to one or more of the features described herein, the controller is configured to estimate or predict a state of the energy storage system based on at least one of the estimated impedance, and impedance data derived one or more other vehicles.

In addition to one or more of the features described herein, the converted excitation signal is applied to the battery system of the vehicle, the vehicle including a processor configured to detect a current from the battery system of the vehicle in response to the converted excitation signal, and process the current to estimate the impedance of the battery system of the vehicle.

In addition to one or more of the features described herein, the first energy source is a fuel cell power system, the fuel cell power system including a fuel cell and an internal impedance measurement system, the first excitation signal is generated by the internal impedance measurement system, and the second energy source is a battery system of the charging station.

In addition to one or more of the features described herein, the charging station includes a plurality of first energy sources, each first energy source connected to a respective conversion device, the respective conversion devices configured to be used to concurrently measure impedances of multiple energy storage systems.

In addition to one or more of the features described herein, the first energy source includes a fuel cell power system of the charging station, the second energy source includes an internal charging station battery system, and the charging station includes an electrical junction controllable by the controller to direct the converted excitation signal to the internal charging station battery system or the battery system of the vehicle.

In yet another exemplary embodiment, a computer program product includes a computer-readable memory that has computer-executable instructions stored thereupon, the computer-executable instructions when executed by a processor cause the processor to perform operations. The operations include causing a first energy source to generate a first excitation signal configured for measuring a first energy source impedance of a first energy source, the first energy source being part of a charging station, and controlling a conversion device of the charging station by a controller, the conversion device connected to the first energy source of the charging station. The conversion device is controlled to adjust a parameter of the first excitation signal to convert the first excitation signal to a converted excitation signal that is configured for measuring an impedance of an energy storage system, the energy storage system selected from at least one of a second energy source of the charging station and a battery system of a vehicle. The operations also include applying the converted excitation signal to the energy storage system, detecting a current response of the energy storage system, and estimating an impedance of the energy storage system based on the current response.

In addition to one or more of the features described herein, the charging station includes a plurality of first energy sources, each first energy source connected to a respective conversion device, and the operations include concurrently measuring impedances of multiple energy storage systems using the respective conversion devices.

The above features and advantages, and other features and advantages of the disclosure are readily apparent from the following detailed description when taken in connection with the accompanying drawings.

BRIEF DESCRIPTION OF THE DRAWINGS

Other features, advantages and details appear, by way of example only, in the following detailed description, the detailed description referring to the drawings in which.

DETAILED DESCRIPTION

Figure 1:
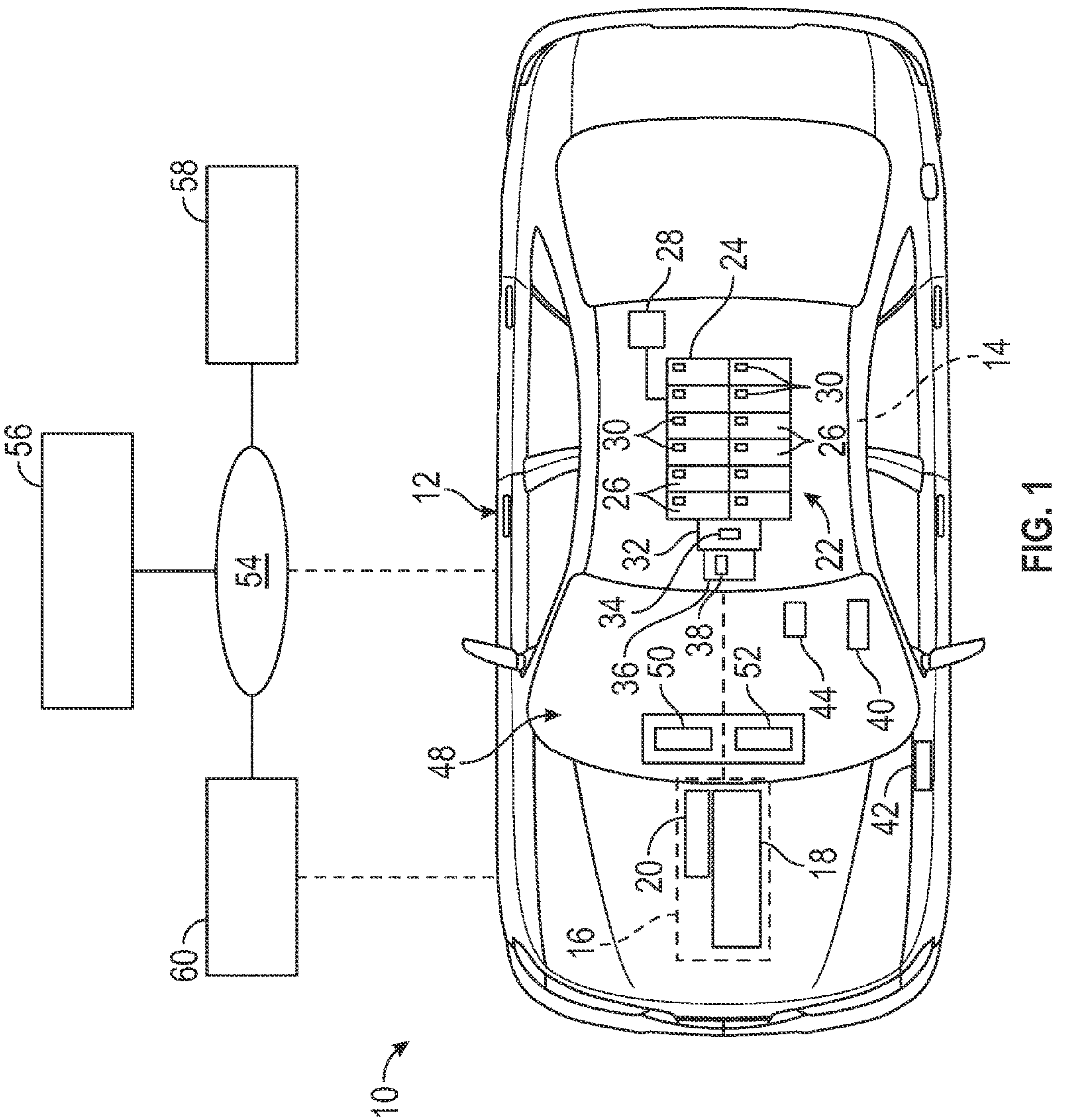
FIG. 1 is a top schematic view of a motor vehicle including a battery system, in accordance with an exemplary embodiment.

The following description is merely exemplary in nature and is not intended to limit the present disclosure, its application or uses. It should be understood that throughout the drawings, corresponding reference numerals indicate like or corresponding parts and features.

In accordance with one or more exemplary embodiments, methods, devices and systems are provided for measuring charging parameters by a charging station and/or controlling aspects of a charging process. An embodiment of a charging control system includes a controller configured to control impedance measurements (impedance excitation spectroscopy (EIS) measurements) of a battery system in the charging station and/or external energy storage systems (e.g., electric vehicle battery systems). The system provides capabilities to a charging station to tailor or customize EIS excitation signals for various energy storage systems.

An impedance measurement is performed by generating an initial excitation signal by an energy source in a charging station, such as a fuel cell system. The initial excitation signal is provided to a conversion device (e.g., a pre-existing conversion device used to control charging parameters), and the conversion device is controlled to adjust an amplitude and/or frequency of the excitation signal for a selected storage system to be measured (e.g., a battery of a vehicle connected to the charging station). A response of the selected storage system is measured by measuring alternating current (AC) through the selected storage system, and the response is analyzed to estimate the impedance.

Embodiments described herein present numerous advantages and technical effects. For example, the embodiments provide for improvements in charging stations by utilizing charging station components to measure impedance of a wide variety of systems, and provide for improved charging cycle control and improved analytical functions. In addition, embodiments can be utilized to collect impedance measurement data to improve monitoring battery pack performance and life cycle. Furthermore, impedance measurement and charging functions described herein can be realized without the need for additional components, as embodiments are able to utilize existing controllers, conversion devices and other components.

The embodiments are not limited to use with any specific vehicle or device or system that utilizes battery assemblies, and may be applicable to various contexts. For example, embodiments may be used with automobiles, trucks, aircraft, construction equipment, farm equipment, automated factory equipment and/or any other device or system that may use high voltage battery packs or other battery assemblies.

FIG. 1 shows an embodiment of a motor vehicle 10, which includes a vehicle body 12 defining, at least in part, an occupant compartment 14. The vehicle body 12 also supports various vehicle subsystems including a propulsion system 16, and other subsystems to support functions of the propulsion system 16 and other vehicle components, such as a braking subsystem, a suspension system, a steering subsystem, a fuel injection subsystem, an exhaust subsystem and others.

The vehicle 10 may be a combustion engine vehicle, an electrically powered vehicle (EV) or a hybrid electric vehicle (HEV). In an example, the vehicle 10 is a hybrid vehicle that includes a combustion engine 18 and an electric motor 20.

The vehicle 10 includes a battery system 22, which may be electrically connected to the motor 20 and/or other components, such as vehicle electronics. In an embodiment, the battery system 22 includes a battery assembly such as a high voltage battery pack 24 having a plurality of battery modules 26. Each of the battery modules 26 includes a number of individual cells (not shown). The battery system 22 may also include a monitoring unit 28 configured to receive measurements from sensors 30. Each sensor 30 may be an assembly or system having one or more sensors for measuring various battery and environmental parameters, such as temperature, current and voltages. The monitoring unit 28 includes components such as a processor, memory, an interface, a bus and/or other suitable components.

The battery system 22 includes various conversion devices for controlling the supply of power from the battery pack 24 to the motor 20 and/or electronic components. The conversion devices include a DC-DC converter module 32 for adjusting direct current (DC). The DC-DC converter module 32 is electrically connected to the battery system 22 and includes a DC-DC converter 34.

The conversion devices also include an inverter module 36 that includes an inverter circuit 38 (referred to herein as an inverter 38). The inverter 38 receives DC power from the DC-DC converter 34 and converts DC power to AC power that is supplied to the electric motor 20.

The vehicle 10 also includes a charging system, which can be used to charge the battery system 22 and/or to supply power from the battery system 22 to charge another energy storage system (e.g., vehicle-to-vehicle (V2V) and/or vehicle-to-everything (V2X) charging). The vehicle charging system includes a charging control device 40, such as an onboard charging module (OBCM). The charging control device 40 is configured to control charging operations (including charging to and from the vehicle 10), and may include a conversion device (charger) for AC-DC conversion and/or DC-DC conversion. The charging control device 40 connects the battery system 22 to a charge port 42 for charging vehicle battery systems and/or providing charge to external storage systems.

The charging control device 40 may be configured to perform other functions, such as monitoring battery parameters (e.g., temperature, voltage, current and impedance) during a charging process, and/or controlling aspects of a charging process. The control device 40 may also perform in-situ impedance and/or temperature measurements. Such measurements may be performed in conjunction with a charging station as described herein.

For example, as further described herein, the charging control device 40 is configured to transmit an excitation signal generated by a charging station and/or estimate impedance based on current measurements of the battery system 22 in response to an excitation signal. An excitation signal, in an embodiment, is an AC or oscillating potential (e.g., pulse or sinusoid), and is also referred to as a perturbation.

The vehicle 10 includes at least one processor or processing device for controlling aspects of measurement and/or charging operations described herein, referred to as a controller 44. The controller 44 may be a separate controller as shown, or part of the charging control module 40, a battery management system (BMS), or a combination thereof. It is noted that embodiments are not limited to any specific controller or processing device, and may encompass multiple processors or control devices.

The vehicle 10 also includes a computer system 48 that includes one or more processing devices 50 and a user interface 52. The computer system 48 may communicate with a controller or vehicle system, for example, to provide commands thereto in response to a user input. The various processing devices, modules and units may communicate with one another via a communication device or system, such as a controller area network (CAN) or transmission control protocol (TCP) bus.

The charging system, the controller 44, the computer system 48 and/or other processing components in the vehicle 10 may be configured to communicate with various remote devices and systems such as charge stations and other vehicles. Such communication can be realized, for example, via a network 54 (e.g., cellular network, cloud, etc.) and/or via wireless communication. For example, the vehicle 10 may communicate with a remote entity 56 (e.g., a workstation, fleet management system, a computer, a server, a service provider, a technician, an engineer, etc.), and/or another vehicle 58. In addition, the vehicle 10 may communicate with a charging station 60, via wireless communication and/or via a charging cable.

A "battery system" may include a battery pack, module, cell or combination thereof. Examples of battery systems include the battery system 22, the battery pack 24, a battery module 26 and any combination thereof. Other examples include battery packs or modules in a charging station.

Figure 2:
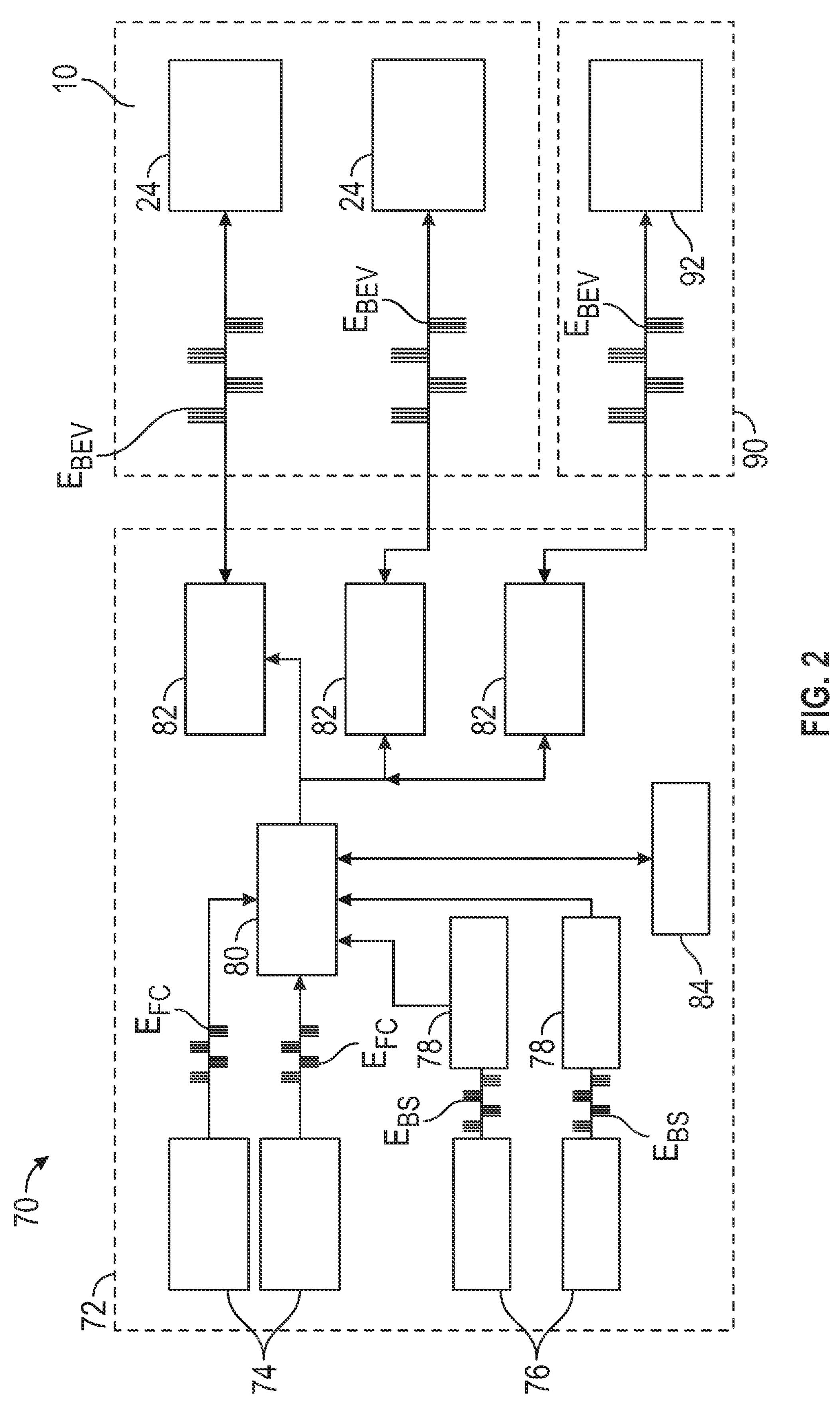
FIG. 2 depicts a charging station including components for performing impedance measurements, in accordance with an exemplary embodiment.

FIG. 2 depicts an embodiment of a charging system 70 configured to supply power to energy storage devices and systems. The charging system 70 includes a charging station 72 (e.g., the charging station 60 of FIG. 1). In an embodiment, the charging station 72 is a mobile charging station, but is not so limited (e.g., the charging station 72 may be a fixed charging station connected to an electrical grid). For example, components of the charging station 72 are disposed on a moveable platform (e.g., a flatbed).

The charging station 72, in an embodiment, includes one or more fuel cell power systems 74 (referred to herein as "power cubes" 74). Each power cube 74 includes one or more fuel cells (e.g., a fuel cell stack) and one or more conversion devices. Each power cube 74 may include components for controlling current and voltage output. In addition, each power cube 74 includes components for measuring an internal impedance of the power cube 74. For example, a power cube 74 includes components for performing electrochemical impedance spectroscopy (EIS).

EIS involves applying an AC potential (excitation signal) having a selected amplitude, and having a frequency that is varied or swept within a selected frequency range. The AC potential excites a current in an energy storage device (e.g., a battery pack or fuel cell stack), which is measured as a current signal. The current signal is compared to the AC potential waveform to estimate the impedance. The impedance is denoted as Z, and can be expressed in terms of a magnitude $Z_0$ and a phase shift Φ. In an embodiment, the impedance Z is a complex impedance having a real part and an imaginary part.

The charging station 72 may also include one or more energy storage systems, such as one or more battery systems 76. Each battery system 76 includes, for example, a high voltage battery pack including a plurality of battery modules and/or battery cells. A battery system 76 may include any suitable chemistry, such as a Lithium-based chemistry. In an embodiment, each battery system 76 is configured as a rechargeable energy storage system (RESS) having an RESS controller or other suitable control device. Each battery system 76 is connected to a respective conversion device, such as a DC-DC converter 78.

Each DC-DC converter 78 is used to control the DC voltage output from a respective battery system 76. In addition, each DC-DC converter 78 is controllable to apply an AC potential to a battery system 76 for measuring an impedance of the battery system 76. As described further herein, this impedance measurement is performed by adjusting an excitation signal from a power cube 74, to tailor the excitation signal for the battery system 76.

For example, an initial excitation signal $E_{FC}$ generated by a power cube 74 is transmitted to a high voltage (HV) junction 80, and the amplitude and/or frequency of the initial excitation signal $E_{FC}$ is controlled by the DC-DC converter 78 based on battery parameters such as chemistry, age and state of charge (SOC). Control of the initial excitation signal results in an adjusted or converted excitation signal $E_{BS}$. The converted excitation signal $E_{BS}$ excites a current (excited current or current signal $i_E$) that is measured and used to estimate the impedance Z of a battery system 76.

The charging system 70 also includes one or more DC-DC converters 82, which are configured to control the DC voltage of charging current supplied to an external energy storage system, such as a battery pack 24 of the vehicle 10 or a battery pack 92 of another vehicle 90 connected to the charging station 72. Each DC-DC converter 82 is also controllable to adjust an excitation signal $E_{FC}$ from a power cube 74, and configure the excitation signal based on properties of the external energy storage system. For example, a converted excitation signal $E_{BEV}$, having an amplitude and frequency range tailored to a battery pack 24, is provided to the battery pack 24 during charging to monitor the impedance Z of the battery pack 24.

In an embodiment, control of the DC-DC converters 78 and 82 is performed by a charging system controller 84. The charging system controller 84 may also be configured to receive current signals and/or analyze current signals to estimate impedance of a given component.

Figure 3:
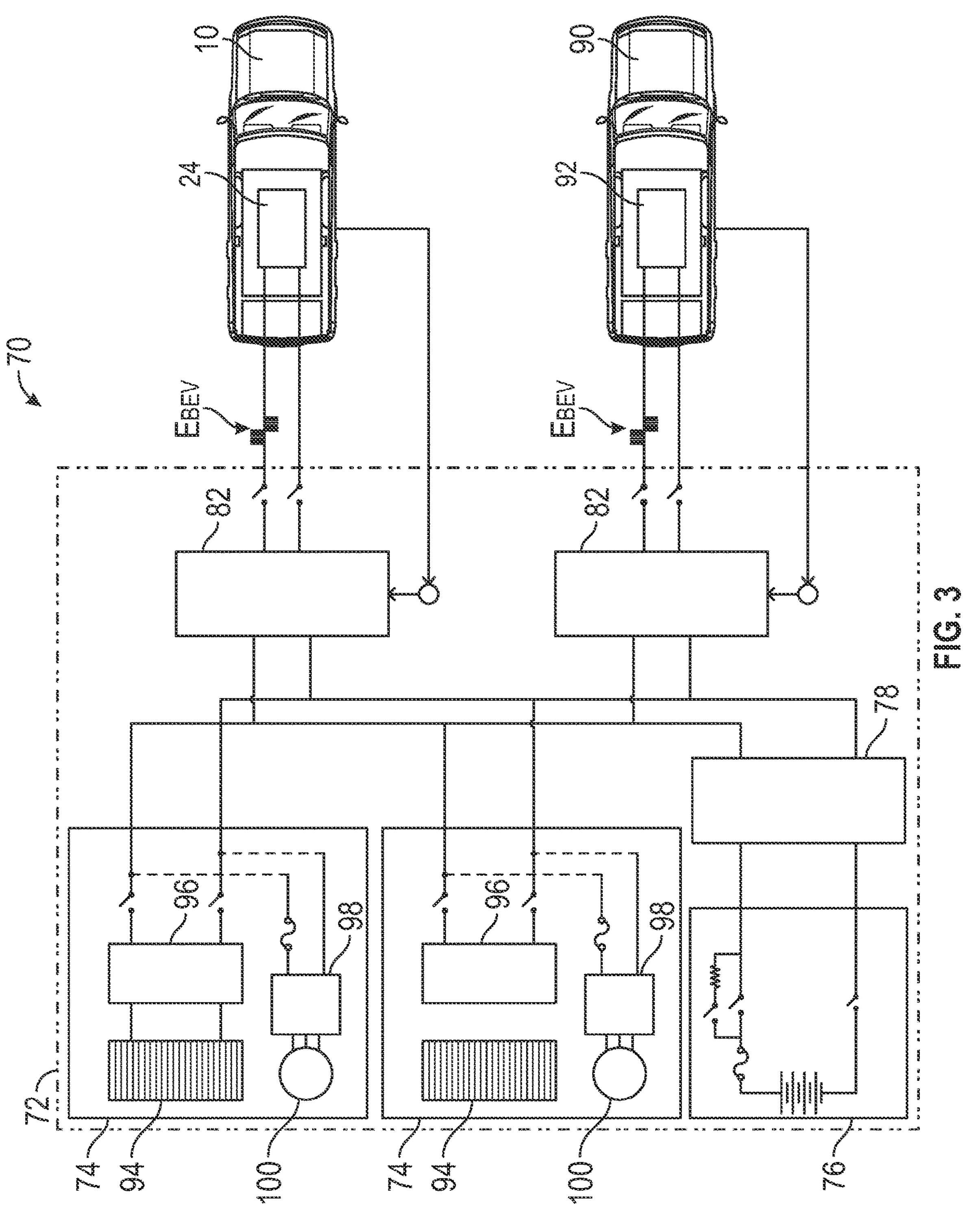
FIG. 3 depicts a charging station including components for performing impedance measurements and depicts aspects of a charging process, in accordance with an exemplary embodiment.

FIG. 3 depicts an embodiment of the charging system 70, and shows various components of the power cubes 74 and the battery systems 76.

Each power cube 74 includes a fuel cell stack 94 and a boost converter 96 for supplying DC power during a charging operation. Each power cube 74 also includes a control system that can be used to control the boost converter 96. In an embodiment, the control system includes a compressor power inverter module (CPIM) 98 and associated compressor motor 100. The CPIM 98 can be used to provide an excitation signal $E_{FC}$ for estimation of fuel cell stack impedance.

In an embodiment, the various conversion devices used for impedance measurements are pre-existing devices. For example, the DC-DC converter 78 is a boost converter that is typically used to control the voltage output of the battery pack 76. The DC-DC converters 82 may be pre-existing converters used to control output voltage to external systems when charging. Additionally, the controller 84 (see FIG. 2) may be a pre-existing charging control module used to control charging operations.

Figure 4:
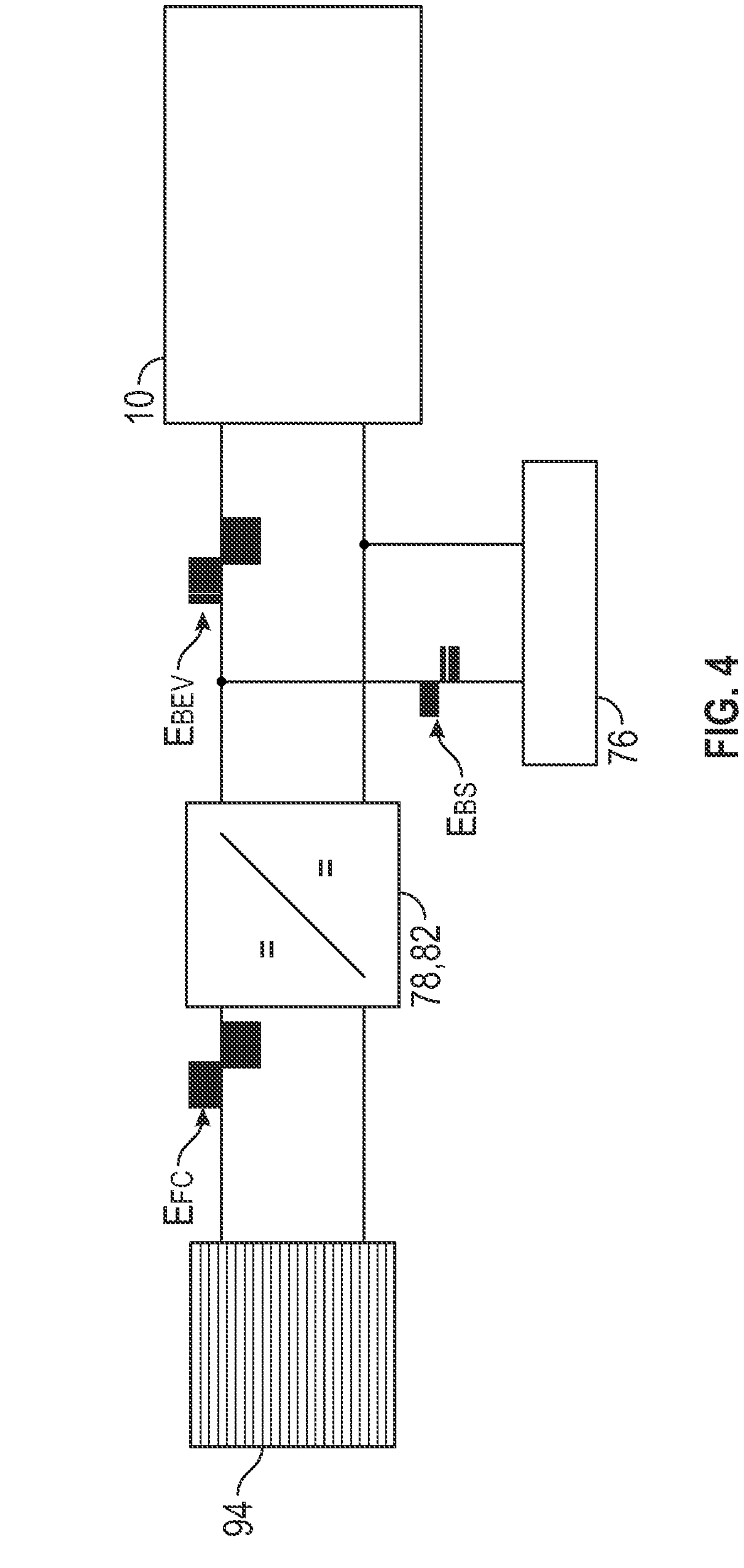
FIG. 4 schematically depicts components of a charging station and excitation signals used to measure impedance, in accordance with an exemplary embodiment.

FIG. 4 schematically illustrates aspects of impedance measurements.

In this example, a power cube 74 is controlled (e.g., via the CPIM 98) to generate an excitation signal $E_{FC}$ that is designed for measuring an impedance $Z_{FCS}$ of the fuel cell stack 94. To perform an impedance measurement of an external energy storage system, such as a battery pack of the vehicle 10, the excitation signal $E_{FC}$ is adjusted as desired (e.g., by adjusting the frequency and/or amplitude) to create an excitation signal $E_{BEV}$ designed for the vehicle battery pack. Likewise, to perform an impedance measurement of a battery system 76 (or other battery system of the charging station 70), the excitation signal $E_{FC}$ is adjusted to create an excitation signal $E_{BS}$ designed for the battery system 76. As illustrated in this embodiment, a single energy source can be effectively used for impedance measurements of a variety of different systems.

Figure 5:
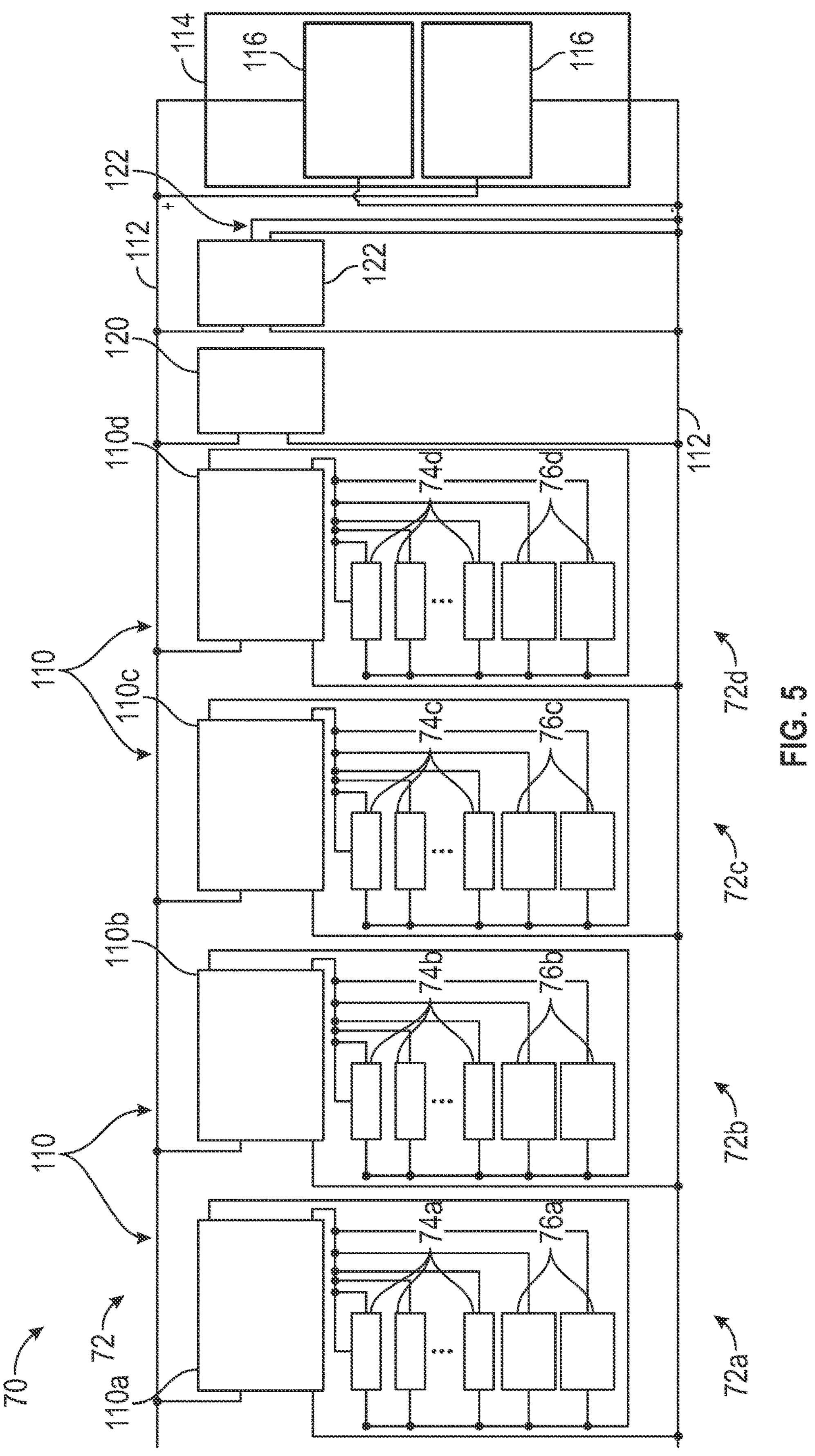
FIG. 5 depicts a charging station including components for performing impedance measurements, in accordance with an exemplary embodiment.
Figure 6:
FIG. 6 is a flow diagram depicting aspects of a method of performing impedance measurements and controlling a charging process, in accordance with an exemplary embodiment.
Figure 6:
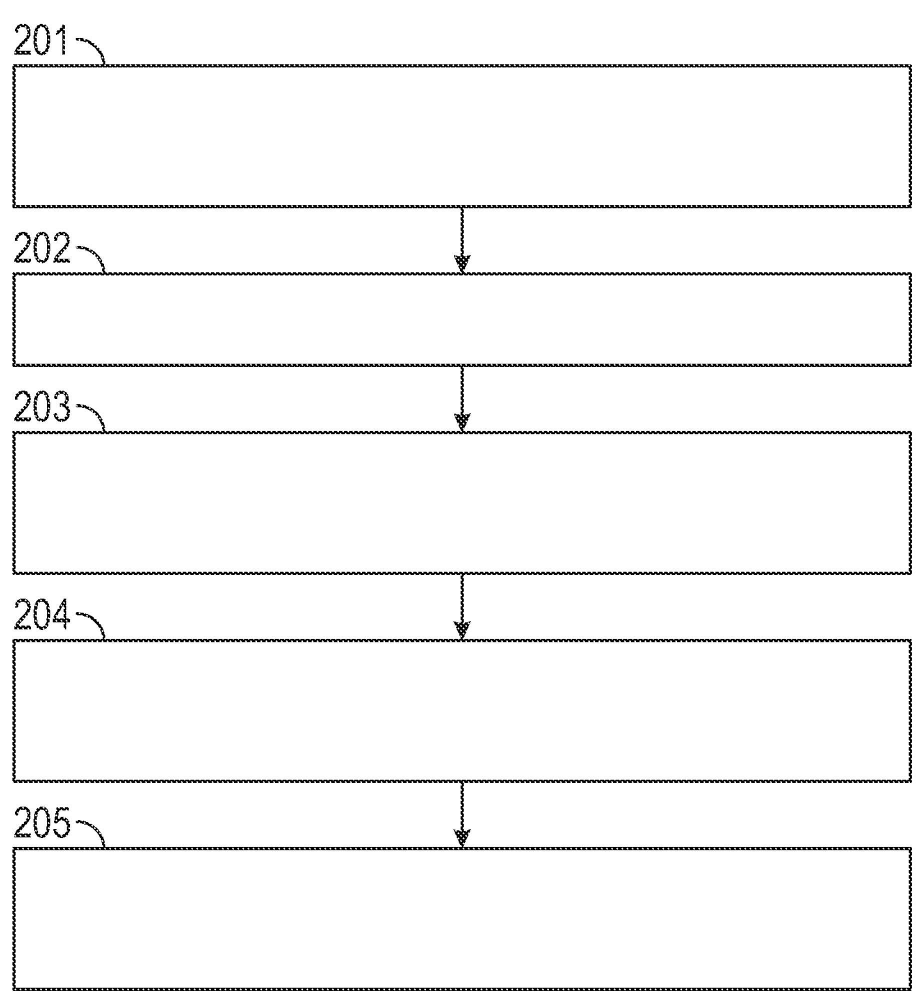

In an embodiment, the charging control system and the charging station 72 are scalable to accommodate larger size vehicles. FIG. 5 depicts an embodiment of the charging station 72, which includes a plurality of separate power source assemblies (referred to as charging station legs or subsystems) that can be combined as desired to charge vehicles with multiple battery packs and inverters.

In an embodiment, the charging station 72 includes a plurality of subsystems 72*a*-72*d*, where each subsystem includes an interfacing converter 110 (converters 110*a*-110*d*). The subsystems 72*a*-72*d* are connected to one another in parallel to a power bus 112. The power bus 112 is connectable to an external energy storage system for transmission of charging current. For example, the power bus 112 can be connected to a vehicle 114 having multiple inverters 116 and associated motors. The charging station 72 can thus be scaled by providing power from two or more subsystems to provide for higher magnitude charging currents.

Additional components may be included. For example, an additional converter 120 is included for providing power to electronics, controllers and other components (e.g., 12V components). A circuit breaker system 122 may also be connected to the power bus 112.

In this embodiment, each interfacing converter 110 is configured to facilitate an impedance of a respective subsystem, referred to as a combined impedance. For example, to measure a combined impedance of the subsystem 72*a*, an excitation signal is generated by a power cube 74*a*. The excitation signal is adjusted by the interfacing converter 110*a* and applied to the subsystem 72*a*. A controller in the subsystem 72*a*, or a charging station controller, receives current measurements and estimates impedance by analyzing the current measurements.

As noted herein, impedance calculations may be performed by a controller or controllers in a charging station and/or in a connected vehicle. Embodiments are not so limited, as the calculations may be performed by any suitable processing device. For example, excitation signal information and current measurements may be transmitted to a remote location (e.g., a workstation or service center) for analysis.

Figure 7:
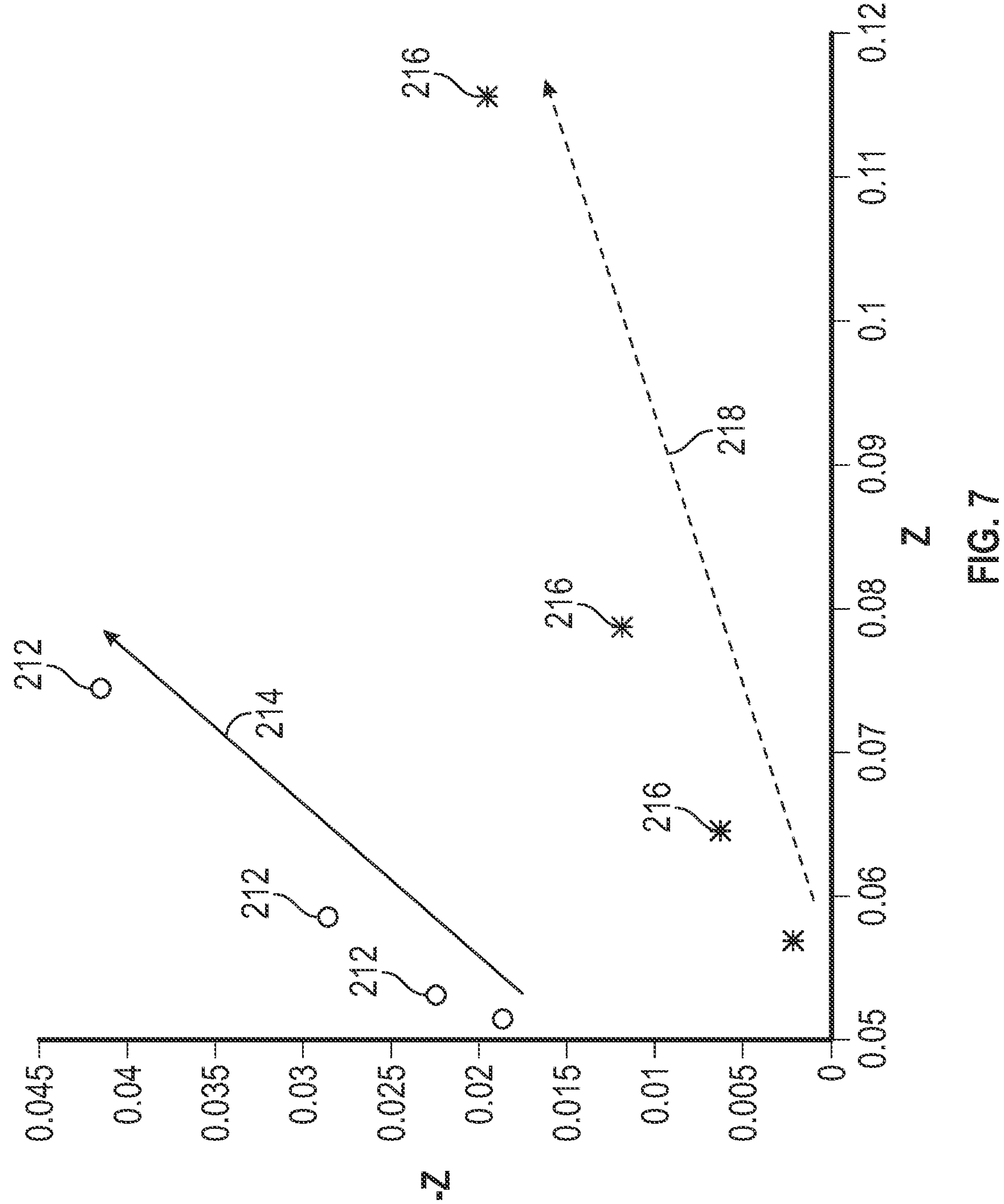
FIG. 7 depicts an example of impedance measurements performed on a battery pack.

FIG. 7 illustrates embodiments of a method 200 of performing measurements and/or controlling a charging operation. Aspects of the method 200 may be performed by a processor or combination of processors. For example, impedance measurements may be performed via a controller in a charging station, a controller in a vehicle, or both controllers in combination. In other examples, such as charging one or more vehicles from a charging station, the method may be performed by a controller in the charging station and/or controller(s) within connected vehicle(s).

It is noted the method 200 is not so limited and may be performed by any suitable processing device or system, or combination of processing devices. Accordingly, discussion of specific components used to perform the method 200 is not intended to be limiting.

The method 200 includes a number of steps or stages represented by blocks 201-205. The method 200 is not limited to the number or order of steps therein, as some steps represented by blocks 201-205 may be performed in a different order than that described below, or fewer than all of the steps may be performed.

At block 201, a processing device such as the charging system controller 84 receives a request for power transfer from the charging station 72 to an external energy storage system, such as the battery system 22 of the vehicle 10. The request may be provided via a wireless communication or through a charging cable connecting the charge port 42 to an appropriate port or interface of the charging station 72. The controller 84 determines various power transfer parameters, such as load requirements and/or charging parameters.

At block 202, charging is initiated. For example, one or more of the power cubes 74 and the battery packs 76 are electrically connected to a DC-DC converter 82 connected to the vehicle 10. The DC-DC converter 82 is controlled as desired to adjust the voltage of the charging current. It is noted that any combination of power cubes and battery systems may be operated to provide a charging current to the vehicle battery system 22.

At block 203, an impedance measurement is performed during the charging process. The impedance measurement includes generating an AC excitation signal $E_{FC}$ and applying the excitation signal $E_{FC}$ to the battery system via the connected DC-DC converter 82. The DC-DC converter 82 is controlled to adjust the magnitude and/or frequency and thereby output an excitation signal $E_{BEV}$ configured for the battery system 22. The controller 84 (and/or other processing device) measures the impedance based on an AC current in the battery system 22.

In an embodiment, impedance measurements are performed separately by different processing devices. For example, AC current measurements of the battery system 22 are provided to the charging system controller 44 of the vehicle, and the controller 44 estimates the impedance. The impedance may be used to enhance battery state estimations (e.g., state of charge, state of health, etc.). The AC measurements are also provided to the charging system controller 84, which separately estimates the impedance. The estimations may be cross-checked to enhance accuracy.

It is noted that impedance measurements may be performed during the charging process, and may optionally be performed at other times. For example, the impedance of the battery system is measured before and/or after charging.

At block 204, the charging process is controlled based on impedance measurements and other suitable measurements, which are performed periodically and used as feedback for controlling the charging current. For example, impedance and temperature measurements are used to control a charging current setpoint determined by a controller.

In addition to impedance measurements, other parameters may be monitored during charging and used as part of the feedback control. Examples include battery voltage, charging current amplitude, battery state estimations and/or temperature. Temperature may be derived from impedance measurements, and/or may be determined from other temperature sensors.

At block 205, impedance measurements and/or other information related to the charging process are stored as data for various purposes. Impedance data may be collected as historical data, which can be used to evaluate charging performance, monitor battery aging, and improving aspects of battery management.

Charge station impedance measurements can provide data that can improve or enhance early warning for battery characteristic changes related to thermal runaway. Online impedance measurements can also be used for creating a data rich pedigree for determining 2nd life sorting and disposition of vehicle and charging station battery packs.

In addition, impedance measurements for multiple vehicles can be collected as fleet data, and used for SOC and SOH information which has been enhanced through impedance data. The fleet data can be used to improve vehicle routing, maintenance intervals, and logistics management.

For example, impedance measurements performed on a battery pack during are stored in a suitable location (e.g., data center, fleet management system, server, etc.) for each charging process (e.g., each time a given vehicle is charged by a charging station having impedance measurement capabilities as described herein). In this way, a history of impedance characteristics is collected and can be used to evaluate aging and monitor remaining useful life, as well as make predictions. For example, collected impedance measurement data is analyzed via a machine learning algorithm and/or modelling to predict future states of a battery system. It is noted that predictions of future states (e.g., state of energy storage of a battery system) may be based on local predictions or estimations, and/or based on impedance data and other data from other vehicles.

FIG. 7 is a graph 210 representing a complex impedance of a battery pack. In this example, the battery pack was tested at 25 degrees Celsius with a frequency range of 0.04 Hz to 0.01 Hz.

The graph 210 represents both real and imaginary parts of impedance. An x-axis represents the real part (denoted as Z) and a y-axis represents the imaginary part (denoted as −Z). An initial impedance measurement of the battery pack is shown by measurement points 212 fit to a curve 214. An additional measurement was performed on the battery pack after a number of charging cycles, shown by measurement points 216 fit to a curve 218.

The initial pack measurement may be a measurement of the same battery pack as shown, but is not so limited. For example, the initial impedance may be derived from measurements of a different battery pack using the same or similar impedance measurement parameters (e.g., same frequency range). The different battery pack may be a battery pack with similar properties and/or usage profile, or a different battery pack within the same vehicle.

Figure 8:
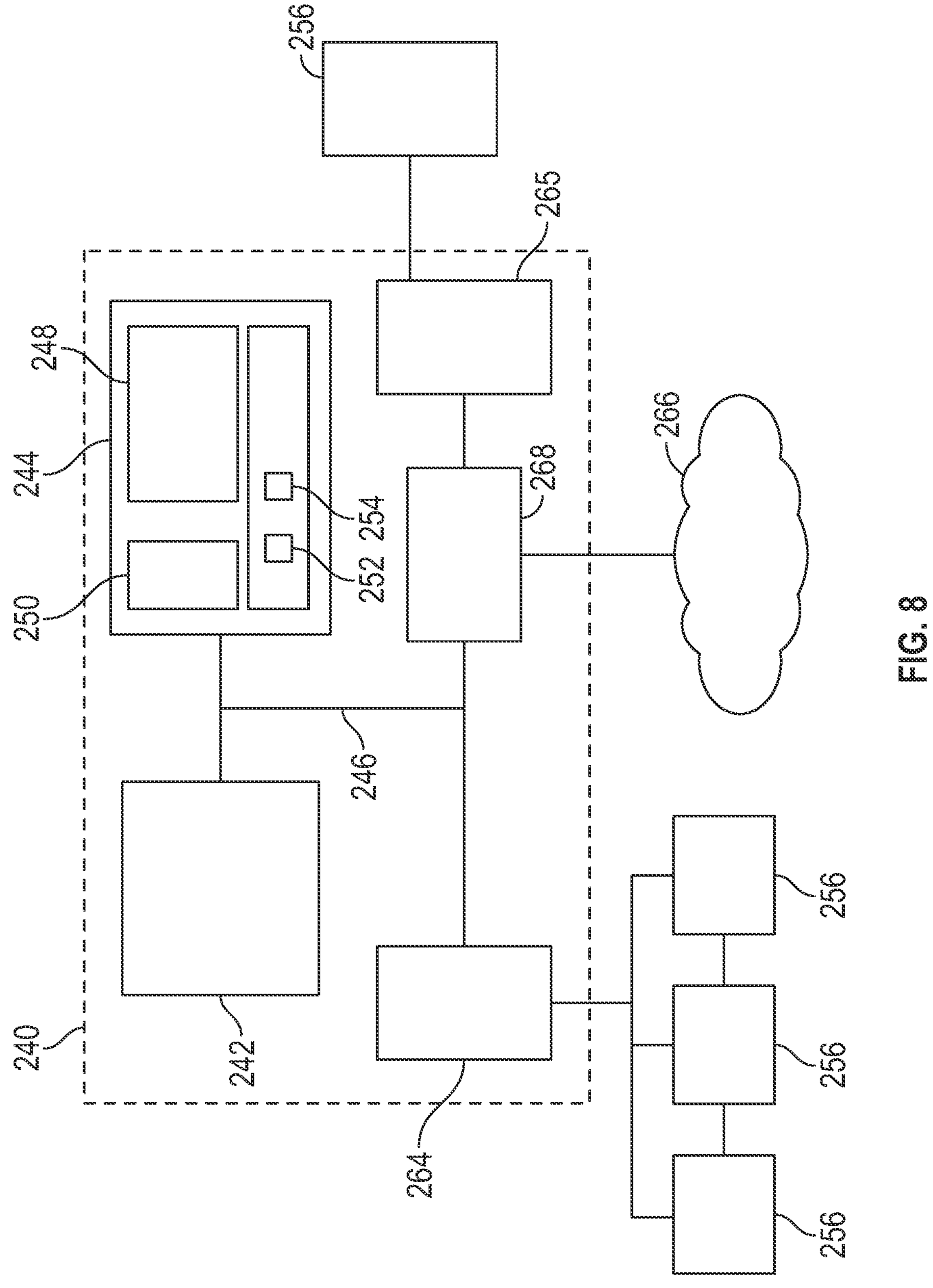
FIG. 8 depicts a computer system in accordance with an exemplary embodiment.

FIG. 8 illustrates aspects of an embodiment of a computer system 240 that can perform various aspects of embodiments described herein. The computer system 240 includes at least one processing device 242, which generally includes one or more processors for performing aspects of image acquisition and analysis methods described herein.

Components of the computer system 240 include the processing device 242 (such as one or more processors or processing units), a memory 244, and a bus 246 that couples various system components including the system memory 244 to the processing device 242. The system memory 244 can be a non-transitory computer-readable medium, and may include a variety of computer system readable media. Such media can be any available media that is accessible by the processing device 242, and includes both volatile and non-volatile media, and removable and non-removable media.

For example, the system memory 244 includes a non-volatile memory 248 such as a hard drive, and may also include a volatile memory 250, such as random access memory (RAM) and/or cache memory. The computer system 240 can further include other removable/non-removable, volatile/non-volatile computer system storage media.

The system memory 244 can include at least one program product having a set (i.e., at least one) of program modules that are configured to carry out functions of the embodiments described herein. For example, the system memory 244 stores various program modules that generally carry out the functions and/or methodologies of embodiments described herein. A module 252 may be included for performing functions related to performing impedance measurements, and a module 254 may be included to perform functions related to control of charging processes. The system 240 is not so limited, as other modules may be included. As used herein, the term "module" refers to processing circuitry that may include an application specific integrated circuit (ASIC), an electronic circuit, a processor (shared, dedicated, or group) and memory that executes one or more software or firmware programs, a combinational logic circuit, and/or other suitable components that provide the described functionality.

The processing device 242 can also communicate with one or more external devices 256 as a keyboard, a pointing device, and/or any devices (e.g., network card, modem, etc.) that enable the processing device 242 to communicate with one or more other computing devices. Communication with various devices can occur via Input/Output (I/O) interfaces 264 and 265.

The processing device 242 may also communicate with one or more networks 266 such as a local area network (LAN), a general wide area network (WAN), a bus network and/or a public network (e.g., the Internet) via a network adapter 268. It should be understood that although not shown, other hardware and/or software components may be used in conjunction with the computer system 40. Examples include, but are not limited to: microcode, device drivers, redundant processing units, external disk drive arrays, RAID systems, and data archival storage systems, etc.

The terms "a" and "an" do not denote a limitation of quantity, but rather denote the presence of at least one of the referenced item. The term "or" means "and/or" unless clearly indicated otherwise by context. Reference throughout the specification to "an aspect", means that a particular element (e.g., feature, structure, step, or characteristic) described in connection with the aspect is included in at least one aspect described herein, and may or may not be present in other aspects. In addition, it is to be understood that the described elements may be combined in any suitable manner in the various aspects.

When an element such as a layer, film, region, or substrate is referred to as being "on" another element, it can be directly on the other element or intervening elements may also be present. In contrast, when an element is referred to as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this invention belongs.

While the above disclosure has been described with reference to exemplary embodiments, it will be understood by those skilled in the art that various changes may be made and equivalents may be substituted for elements thereof without departing from its scope. In addition, many modifications may be made to adapt a particular situation or material to the teachings of the disclosure without departing from the essential scope thereof. Therefore, it is intended that the present disclosure not be limited to the particular embodiments disclosed, but will include all embodiments falling within the scope thereof.

What is claimed is:

1. A system comprising:

a conversion device of a charging station, the conversion device connected to a first energy source of the charging station; and a controller configured to perform an impedance measurement applied to an energy storage system, the energy storage system selected from at least one of a second energy source of the charging station and a battery system of a vehicle, the controller configured to:

cause the first energy source to generate a first excitation signal configured for measuring a first energy source impedance;

control the conversion device to adjust a parameter of the first excitation signal to convert the first excitation signal to a converted excitation signal that is configured for measuring an impedance of the energy storage system; and apply the converted excitation signal to the energy storage system, detect a current response of the energy storage system, and estimate the impedance of the energy storage system based on the current response.

2. The system of claim 1, wherein the controller includes at least one of a processing device internal to the charging station and a processing device of the vehicle, and the controller is configured to control a charging operation based on the estimated impedance.

3. The system of claim 1, wherein the controller is configured to provide the estimated impedance to a data collection system, the data collection system configured to collect a plurality of impedance measurements for analysis.

4. The system of claim 1, wherein the controller is configured to estimate or predict a state of the energy storage system based on at least one of the estimated impedance, and impedance data derived one or more other vehicles.

5. The system of claim 1, wherein the converted excitation signal is applied to the battery system of the vehicle, the vehicle including a processor configured to detect a current from the battery system of the vehicle in response to the converted excitation signal, and process the current to estimate the impedance of the battery system of the vehicle.

6. The system of claim 1, wherein the first energy source is a fuel cell power system, the fuel cell power system including a fuel cell and an internal impedance measurement system, and the first excitation signal is generated by the internal impedance measurement system.

7. The system of claim 6, wherein the second energy source is a battery system of the charging station.

8. The system of claim 1, wherein the conversion device is a direct current (DC)-DC converter electrically connected to the energy storage system.

9. The system of claim 1, wherein the charging station includes a plurality of first energy sources, each first energy source connected to a respective conversion device, the respective conversion devices configured to be used to concurrently measure impedances of multiple energy storage systems.

10. The system of claim 1, wherein the first energy source includes a fuel cell power system of the charging station, the second energy source includes an internal charging station battery system, and the charging station includes an electrical junction controllable by the controller to direct the converted excitation signal to the internal charging station battery system or the battery system of the vehicle.

11. A method comprising:

causing a first energy source to generate a first excitation signal configured for measuring a first energy source impedance of a first energy source, the first energy source being part of a charging station;

controlling a conversion device of the charging station by a controller, the conversion device connected to the first energy source of the charging station, wherein the conversion device is controlled to adjust a parameter of the first excitation signal to convert the first excitation signal to a converted excitation signal that is configured for measuring an impedance of an energy storage system, the energy storage system selected from at least one of a second energy source of the charging station and a battery system of a vehicle; and applying the converted excitation signal to the energy storage system, detecting a current response of the energy storage system, and estimating an impedance of the energy storage system based on the current response.

12. The method of claim 11, wherein the controller includes at least one of a processing device internal to the charging station and a processing device of the vehicle, and the controller is configured to control a charging operation based on the estimated impedance.

13. The method of claim 11, further comprising providing the estimated impedance a data collection system, the data collection system configured to collect a plurality of impedance measurements for analysis thereof.

14. The method of claim 11, wherein the controller is configured to estimate or predict a state of the energy storage system based on at least one of the estimated impedance, and impedance data derived one or more other vehicles.

15. The method of claim 11, wherein the converted excitation signal is applied to the battery system of the vehicle, the vehicle including a processor configured to detect a current from the battery system of the vehicle in response to the converted excitation signal, and process the current to estimate the impedance of the battery system of the vehicle.

16. The method of claim 11, wherein the first energy source is a fuel cell power system, the fuel cell power system including a fuel cell and an internal impedance measurement system, the first excitation signal is generated by the internal impedance measurement system, and the second energy source is a battery system of the charging station.

17. The method of claim 11, wherein the charging station includes a plurality of first energy sources, each first energy source connected to a respective conversion device, the respective conversion devices configured to be used to concurrently measure impedances of multiple energy storage systems.

18. The method of claim 11, wherein the first energy source includes a fuel cell power system of the charging station, the second energy source includes an internal charging station battery system, and the charging station includes an electrical junction controllable by the controller to direct the converted excitation signal to the internal charging station battery system or the battery system of the vehicle.

19. A computer program product comprising a computer-readable memory that has computer-executable instructions stored thereupon, the computer-executable instructions when executed by a processor cause the processor to perform operations comprising:

causing a first energy source to generate a first excitation signal configured for measuring a first energy source impedance of a first energy source, the first energy source being part of a charging station;

controlling a conversion device of the charging station by a controller, the conversion device connected to the first energy source of the charging station, wherein the conversion device is controlled to adjust a parameter of the first excitation signal to convert the first excitation signal to a converted excitation signal that is configured for measuring an impedance of an energy storage system, the energy storage system selected from at least one of a second energy source of the charging station and a battery system of a vehicle; and applying the converted excitation signal to the energy storage system, detecting a current response of the energy storage system, and estimating an impedance of the energy storage system based on the current response.

20. The computer program product of claim 19, wherein the charging station includes a plurality of first energy sources, each first energy source connected to a respective conversion device, and the operations include concurrently measuring impedances of multiple energy storage systems using the respective conversion devices.

* * * * *